(12) United States Patent
Nguyen et al.

(10) Patent No.: US 8,842,357 B2
(45) Date of Patent: Sep. 23, 2014

(54) ELECTROCHROMIC DEVICE AND METHOD FOR MAKING ELECTROCHROMIC DEVICE

(75) Inventors: Paul P. Nguyen, San Jose, CA (US); Shiwei Liu, Santa Rosa, CA (US)

(73) Assignee: View, Inc., Milpitas, CA (US)

( * ) Notice: Subject to any disclaimer, the term of this patent is extended or adjusted under 35 U.S.C. 154(b) by 1016 days.

(21) Appl. No.: 12/347,953

(22) Filed: Dec. 31, 2008

(65) Prior Publication Data

US 2010/0165440 A1    Jul. 1, 2010

(51) Int. Cl.
*G02F 1/155* (2006.01)

(52) U.S. Cl.
CPC ........................... *G02F 1/155* (2013.01)
USPC .......................................................... 359/265

(58) Field of Classification Search
USPC ................ 359/265–275; 427/124, 248.1, 427/250–251, 255.19, 255.21, 404; 216/13; 204/192.1
See application file for complete search history.

(56) References Cited

U.S. PATENT DOCUMENTS

| | | | | |
|---|---|---|---|---|
| 5,133,594 A * | 7/1992 | Haas et al. | ..................... | 359/275 |
| 5,532,869 A * | 7/1996 | Goldner et al. | ................ | 359/275 |
| 7,372,610 B2 * | 5/2008 | Burdis et al. | .................. | 359/265 |

OTHER PUBLICATIONS

C.M. Lampert, "Toward large-area photovoltiac nanocells: experiences learned from smart window technology," Solar Energy Materials And Solar Cells 32 (1994) pp. 307-321.
PCT/US2009/006764, Notification of Transmittal of International Search Report and Written Opinion, International Search Report, and Written Opinion, mailed Aug. 13, 2010, 8 pages.

* cited by examiner

*Primary Examiner* — Zachary Wilkes
(74) *Attorney, Agent, or Firm* — Weaver Austin Villeneuve & Sampson LLP; Brian D. Griedel

(57) ABSTRACT

A method for lithiating an electrochromic device comprise forming a first transparent conductive layer on a substrate, forming an electrochromic structure on the first transparent conductive layer, forming a second transparent conductive layer on the electrochromic structure, and lithiating the electrochromic structure through the second transparent conductive layer. In one exemplary embodiment lithiating the electrochromic structure comprises lithiating the electrochromic structure at a temperature range of between about room temperature and about 500 C for the duration of the lithiation process. In another exemplary embodiment, lithiating the electrochromic structure further comprises lithiating the electrochromic structure by using at least one of sputtering, evaporation, laser ablation and exposure to a lithium salt. The electrochromic device can be configured in either a "forward" or a "reverse" stack configuration.

18 Claims, 5 Drawing Sheets

ELECTROCHROMIC DEVICE AND METHOD FOR MAKING ELECTROCHROMIC DEVICE

BACKGROUND

The subject matter disclosed herein relates to an electrochromic device. More particularly, the subject matter disclosed herein relates to a multi-layer electrochromic stack and a method for making the multi-layer electrochromic stack.

The field of electrochromics is extensive and has been developing over about the last forty years. In one application, an electrochromic coating is used for controlling the amount of light and heat passing through the window based on a user-controlled electrical potential that is applied across the optical stack of the electrochromic coating. Not only can an electrochromic coating reduce the amount of energy used for room heating and/or air conditioning, an electrochromic coating can also be used for providing privacy. By switching between a clear state having an optical transmission of about 60-80% and a darkened state having an optical transmission of between 0.1-10%, both energy flow into a room through a window and privacy provided by the window can be controlled. The amount of glass used for various types of windows, such as skylights, aircraft windows, residential and commercial building windows, and automobile windows, is on the order of one billion square meters per year. Accordingly, the potential energy saving provided by electrochromic glazing is substantial. See, for example, Solar Energy Materials and Solar Cells, (1994) pp. 307-321.

Over the forty years that electrochromics have been developing, various structures for electrochromic devices have been proposed including, solution-phase electrochromic devices, solid-state electrochromic devices, gasochromic devices, and photochromic devices.

For example, a conventional electrochromic cell generally is structured as follows: a substrate, a transparent conductive layer, a counter electrode, an ion transport (or ion conductor) layer, an electrochromic layer, and a transparent conductive layer. Conventional cathodic materials, commonly referred to as "electrochromic electrodes," have included tungsten oxide $WO_3$ (most common), vanadium oxide $V_2O_5$, niobium oxide $Nb_2O_3$ and iridium oxide $IrO_2$. Anodic materials, commonly referred to as "counter electrodes," include nickel oxide NiO, tungsten-doped nickel oxide, and iridium oxide $IrO_2$. The ion transport layer materials exhibit a poor electron conductor, but a good ion conductor. Examples of ion transport layer materials include $SiO_2$, $TiO_2$, $Al_2O_3$, and $Ta_2O_5$.

Various types of transparent conducting thin films have been employed for the first and second transparent conducting layers, such as, indium tin oxide ITO, which is the most commonly used material. Other thin metal layers have also been used, such as fluorine-doped tin oxide, antimony-doped tin oxide, and fluorine-doped aluminum oxide. Regardless which thin film is used, conductivities of less than about 20 Ohms/□ are needed in order to produce a uniform voltage between the two conductive layers across the conductive layers. Even lower conductivities than about 20 Ohms/□ are needed for large panes of glass measuring 3-4 feet across.

If a voltage of between −5 V to +5 V is applied between the first and second transparent conducting layers, the following reactions take place. At the anode, the following reaction takes place:

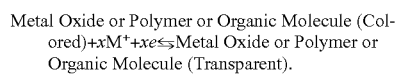

At the cathode, the following reaction takes place:

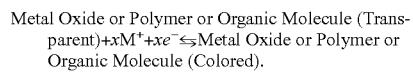

in which M is $H^+$, $Li^+$ or $Na^+$, e is an electron, and x is an integer.

BRIEF DESCRIPTION OF THE DRAWINGS

The subject matter disclosed herein is illustrated by way of example and not by limitation in the accompanying figures in which like reference numerals indicate similar elements and in which.

DETAILED DESCRIPTION

The word "exemplary" is used herein to mean "serving as an example, instance, or illustration." Any embodiment described herein as "exemplary" is not to be construed as necessarily preferred or advantageous over other embodiments. Additionally, the term "last" or "top" when used in reference to a layer of a multi-layer electrochromic device refers to a layer that is toward the top of a device as depicted in the Figures.

Figure 1:
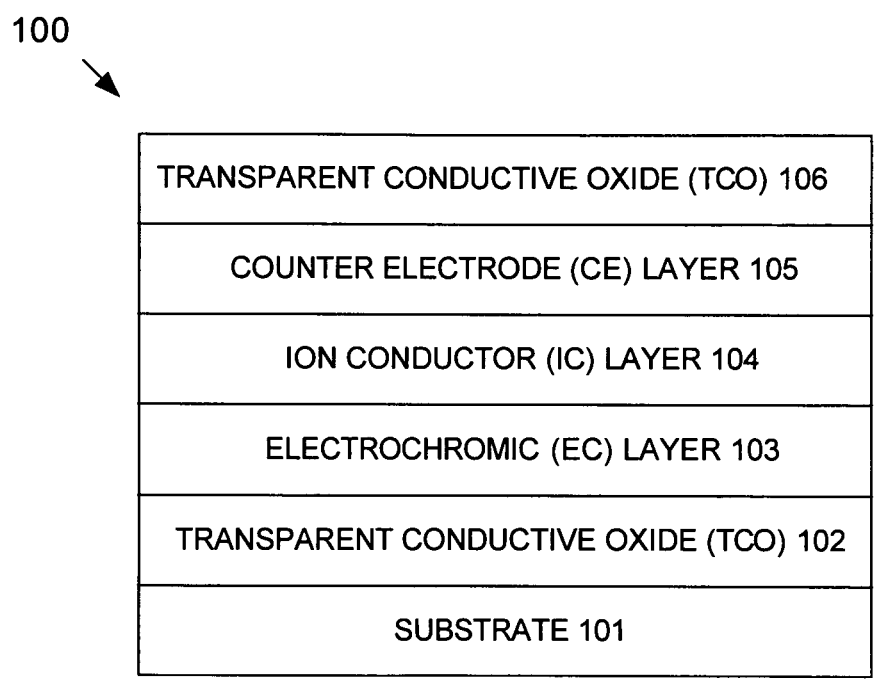
FIG. 1 depicts an exemplary embodiment of a forward arrangement of a multilayer electrochromic device.

FIG. 1 depicts an exemplary embodiment of a forward arrangement of a multilayer electrochromic device 100. Multi-layer electrochromic device (or stack) 100 comprises a first transparent conductive oxide (TCO) layer 102 that is formed on a transparent substrate 101. First TCO layer 102 is formed to have a thickness about 10 nm to about 1000 nm, and can be formed from, for example, indium tin oxide (ITO) (most common), aluminum zinc oxide (AZO), fluorine-doped tin oxide (FTO), antimony-doped tin oxide (ATO), or fluorine-doped aluminum oxide (FAO). An electrochromic (EC) layer 103 is formed on first TCO layer 102. EC layer 103 is formed to have a thickness about 10 nm to about 1000 nm, and is formed from a cathodic electrochromic material, such as, tungsten oxide $WO_3$ (most common), molybdenum oxide $MoO_3$, vanadium oxide $V_2O_5$, niobium oxide $Nb_2O_3$ and iridium oxide $IrO_2$.

An ion conductor (IC) layer 104 is formed on EC layer 103. IC layer 104 is formed to have a thickness about 10 nm to about 2000 nm, and can be formed to be about silicon dioxide $SiO_2$, titanium dioxide $TiO_2$, aluminum oxide $Al_2O_3$, tantalum oxide $Ta_2O_5$, and zirconium oxide $ZrO_2$. A counter electrode (CE) layer 105 is formed on IC layer 104. CE layer 105 is formed to have a thickness of about 10 nm to about 1000 nm, and can be formed from an anodic electrochromic material, such as nickel oxide NiO, iridium oxide $IrO_2$, cobaltous oxide CoO, tungsten-doped nickel oxide, vanadium-doped nickel oxide, and aluminum-doped nickel oxide.

A second (or top) TCO layer 106 is formed on CE layer 105: Second TCO layer 106 is formed to have a thickness about 10 nm to about 1000 nm, and can be formed from, for example, indium tin oxide (ITO) (most common), aluminum zinc oxide (AZO), fluorine-doped tin oxide (FTO), antimony-doped tin oxide (ATO), or fluorine-doped aluminum oxide (FAO).

It should be understood that a multi-layer electrochromic device could be formed in a reverse order from the order of the layers of (forward arrangement) multi-layer electrochromic device 100 so that a first TCO layer is formed on a substrate, a counter electrode (CE) layer is formed on the first TCO layer, an ion conductor (IC) layer is formed on the CE layer, an electrochromic (EC) layer formed on the IC layer, and a second TCO layer formed on the EC layer.

The respective layers of multi-layer electrochromic device 100 are formed using well-known techniques, such as sputtering, evaporation, laser ablation and atomic-layer deposition (ATE). When multi-layer electrochromic device 100 is conventionally formed, the EC layer, IC layer and/or CE layer are optionally lithiated using separate dry lithiation steps in which lithium is deposited via conventional deposition techniques, such as sputtering, evaporation and/or laser ablation techniques, onto the (EC, IC or CE) layer below. Each lithiation step can be titrated (i.e., depositing a determined amount of lithium) in order to provide a desired switching performance for the multi-layer electrochromic device.

As the top TCO layer is deposited on a lithiated layer, intercalation compounds are likely to be formed in the host lattices of the TCO through up-diffusion of lithium. The term "up-diffusion," as it is used herein, means the lithium used for directly lithiating an electrochromic layer migrates into the TCO layer from the lithiated layer below.

The up-diffusion of lithium into the TCO layer is irreversible (or at least partially irreversible) and has two deleterious effects on the whole stack. First, intercalation of lithium degrades the optical properties of the TCO, thereby resulting in the energy loss as light passes through TCO layer. Second, in a typical forward arrangement (i.e., the configuration of layers depicted in FIG. 1) of EC devices, the counter electrode is deposited immediately before the TCO layer, and is generally fully or partially bleached to achieve a more porous structure and reduce the blind charge. As used herein, the term "blind charge" refers to the lithium lost during the process of lithiation or switching of the device. The "lost" lithium will not shuttle between the two electrodes of EC devices while switching. Lithium inside the counter electrode will, however, be partially lost during the deposition of TCO layer, thereby reducing the overall level of available of lithium to the EC device resulting in low-light transmission for the counter electrode. Typically, an electrochromic device that has been formed using conventional direct lithiated techniques loses between about 5% to about 15% of bleached-state transmission and transmission range during the deposition of the top TCO layer. Thus, high transmission in the bleached state of an EC device has been difficult to achieve because the conventional technique of directly lithiating an electrochromic layer immediately before forming the last TCO layer causes the transmission of the TCO layer to be degraded as lithium is up-diffused into the TCO layer.

To avoid up-diffusion of lithium into the top TCO layer, the subject matter disclosed herein provides a technique in which the top electrochromic layer of a multi-layer electrochromic stack is lithiated through the top TCO layer using a well-known technique, such as sputtering, evaporation and/or by laser ablation. Additionally, lithiation can be performed by exposing the electrochromic device to a lithium salt. Under certain temperature conditions, lithium is not incorporated into the top TCO layer when lithiation of the electrochromic layer is performed through the top TCO layer. Lithiation of the top electrochromic layer can be performed through a top TCO layer when the top TCO layer has a thickness between about 10 nm thick to about 1000 nm thick. According to the subject matter disclosed herein, lithium is not incorporated into the top TCO layer when the lithiation is performed in a temperature range of between about 60 C to about 500 C for a time period of between about one minute and about two hours. In another exemplary embodiment, when the top TCO layer is only about 20 nm thick, lithiation of the top electrochromic layer can be performed through the top TCO layer at about room temperature without heating. The minimal temperature for a lithiation-through-TCO process depends on the thickness and physical properties of the TCO layer. Generally, the thicker and denser the top TCO layer, the greater the temperature that should be used for a lithiation-through-TCO process. It is also possible to lithiate an electrochromic layer all the way through an electrochromic stack depending on the amount of lithium that is used regardless whether the stack is a forward or a reverse stack.

According to one exemplary embodiment, a technique for forming a multi-layer electrochromic device comprises lithiating the last (or top) electrochromic layer through the last (or top) TCO layer of the multi-layer stack. For example, lithiation of a top electrochromic layer through about a 130 nm thick ITO layer should be at a temperature that is greater than about 150 C for the duration of the lithiation process.

When the top electrochromic layer is lithiated through the top TCO according to the subject matter disclosed herein, the transmission of the EC device in the bleached state is improved by about 5% to about 15%. Additionally, the color of the EC device is also improved in the bleached state. Moreover, lithiating an EC device in the bleached state through the top TCO layer results in the maximal transmission occurring at the visible light wavelength, while, in contrast, directly lithiating an EC device in a conventional manner often results in the maximal transmission occurring at the near infrared (IR). Further, lithiating an EC device through the top TCO provides a larger transmission range than the transmission range of a directly lithiated EC device. Lithiation through the top TCO layer also allows for addition of lithium Li into a multi-layer electrochromic device, thereby optimizing the performance of the multi-layer stack.

Figure 2:
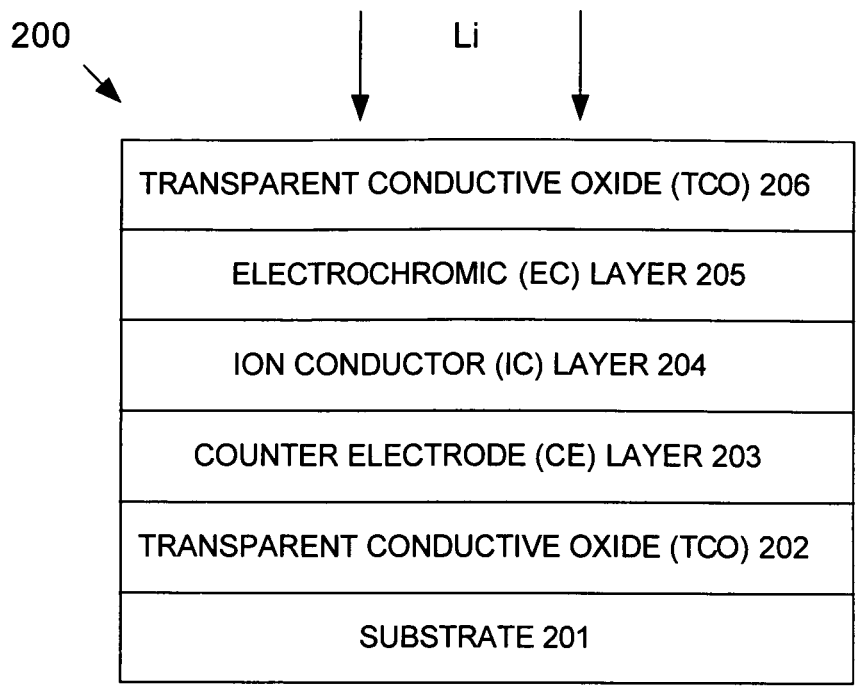
FIG. 2 depicts a first exemplary embodiment of a multi-layer an electrochromic device formed by the subject matter disclosed herein.

FIG. 2 depicts a first exemplary embodiment of a multi-layer an electrochromic device 200 formed by the subject matter disclosed herein. Electrochromic device 200 comprises a transparent substrate 201, such as glass, a first transparent conductive oxide (TCO) layer 202, such as FTO, a counter electrode (CE) layer 203, such as tungsten-doped nickel oxide, an ion conductor (IC) layer 204, such as tantalum oxide $Ta_2O_5$, an electrochromic (EC) layer 205, such as tungsten oxide $WO_3$, and a second (last or top) transparent conductive oxide (TCO) layer 206. The stack order of electrochromic device 200 is commonly referred to as a "reverse" stack. Each layer of device 200 is formed in a well-known manner, such as by sputtering, evaporation, laser ablation and atomic-layer deposition (ATE). The thickness of each layer of device 200 is between about 100 nm to about 400 nm. As electrochromic device 200 is formed, counter electrode (CE) layer 203 and ion conductor (IC) 204 can be optionally directly lithiated in a conventional manner, but electrochromic (EC) layer 205 is not directly lithiated, as might be conventionally done. Instead, TCO layer 206 is formed on EC layer 205, and EC layer 205 is lithiated through TCO layer 206 using Li vapor at a temperature that is greater than about 150 C.

In one alternative exemplary embodiment, top TCO layer 206 could be formed from two layers of a TCO material. For example, a first TCO sublayer 206a (not shown) could be formed to be between about 10 nm to about 500 nm thick. EC layer 205 would then be lithiated through TCO sublayer 206a with or without heating. A second TCO sublayer 206b (not shown) would then be formed in a well-known manner on TCO sublayer 206a formed to be between about 10 nm to about 500 nm thick. EC layer 205 could then be lithiated through both TCO sublayer 206a and TCO sublayer 206b with or without heating.

Figure 3:
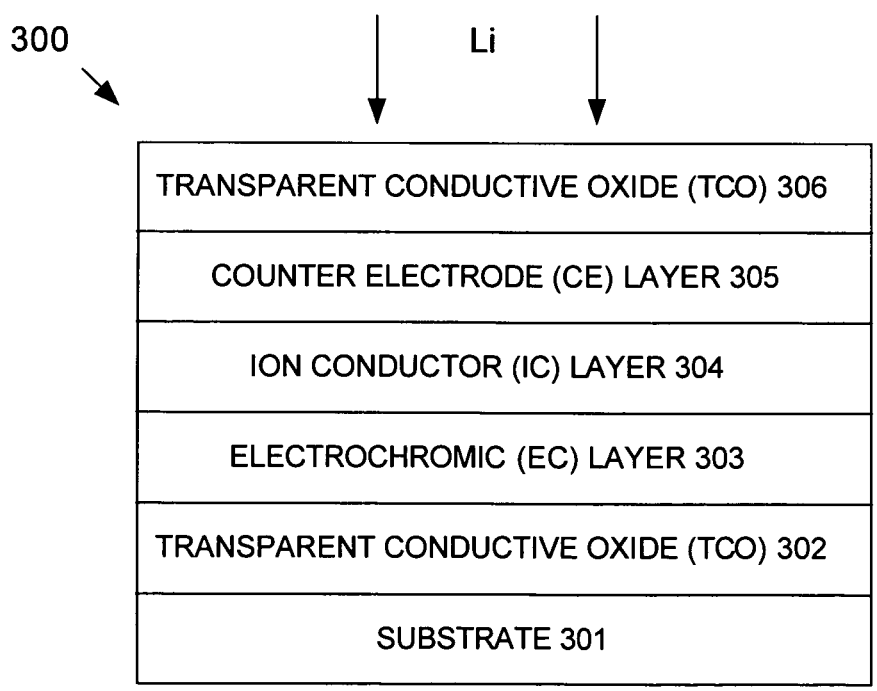
FIG. 3 depicts a second exemplary embodiment of a multi-layer an electrochromic device formed by the subject matter disclosed herein.

FIG. 3 depicts a second exemplary embodiment of a multi-layer an electrochromic device 300 formed by the subject matter disclosed herein. Electrochromic device 300 comprises a transparent substrate 301, such as glass, a first transparent conductive oxide (TCO) layer 302, such as FTO, an electrochromic (EC) layer 303, such as tungsten oxide $WO_3$, an ion conductor (IC) layer 304, such as tantalum oxide $Ta_2O_5$, a counter electrode (CE) layer 305, such as tungsten-doped nickel oxide, and a second (last or top) transparent conductive oxide (TCO) layer 306. The stack order of electrochromic device 300 is commonly referred to as a "forward" stack. Each layer of device 300 is formed in a well-known manner, such as by sputtering, evaporation, laser ablation and atomic-layer deposition (ATE). The thickness of each layer of device 300 is between about 100 nm to about 400 nm. As electrochromic device 300 is formed, electrochromic (EC) layer 303 and ion conductor (IC) 304 can be optionally directly lithiated in a conventional manner, but counter electrode (CE) layer 305 is not directly lithiated, as might be conventionally done. Instead, TCO layer 306 is formed on CE layer 305, and CE layer 305 is lithiated through TCO layer 306 using Li vapor at a temperature that is greater than about 150 C.

In one alternative exemplary embodiment, top TCO layer 306 could be formed from two layers of a TCO material. For example, a first TCO sublayer 306a (not shown) could be formed to be between about 10 nm to about 500 nm thick. CE layer 305 would then be lithiated through TCO sublayer 306a with or without heating. A second TCO sublayer 306b (not shown) would then be formed in a well-known manner on TCO sublayer 306a formed to be between about 10 nm to about 500 nm thick. CE layer 305 could then be lithiated through both TCO sublayer 306a and TCO sublayer 306b with or without heating.

Figure 4:
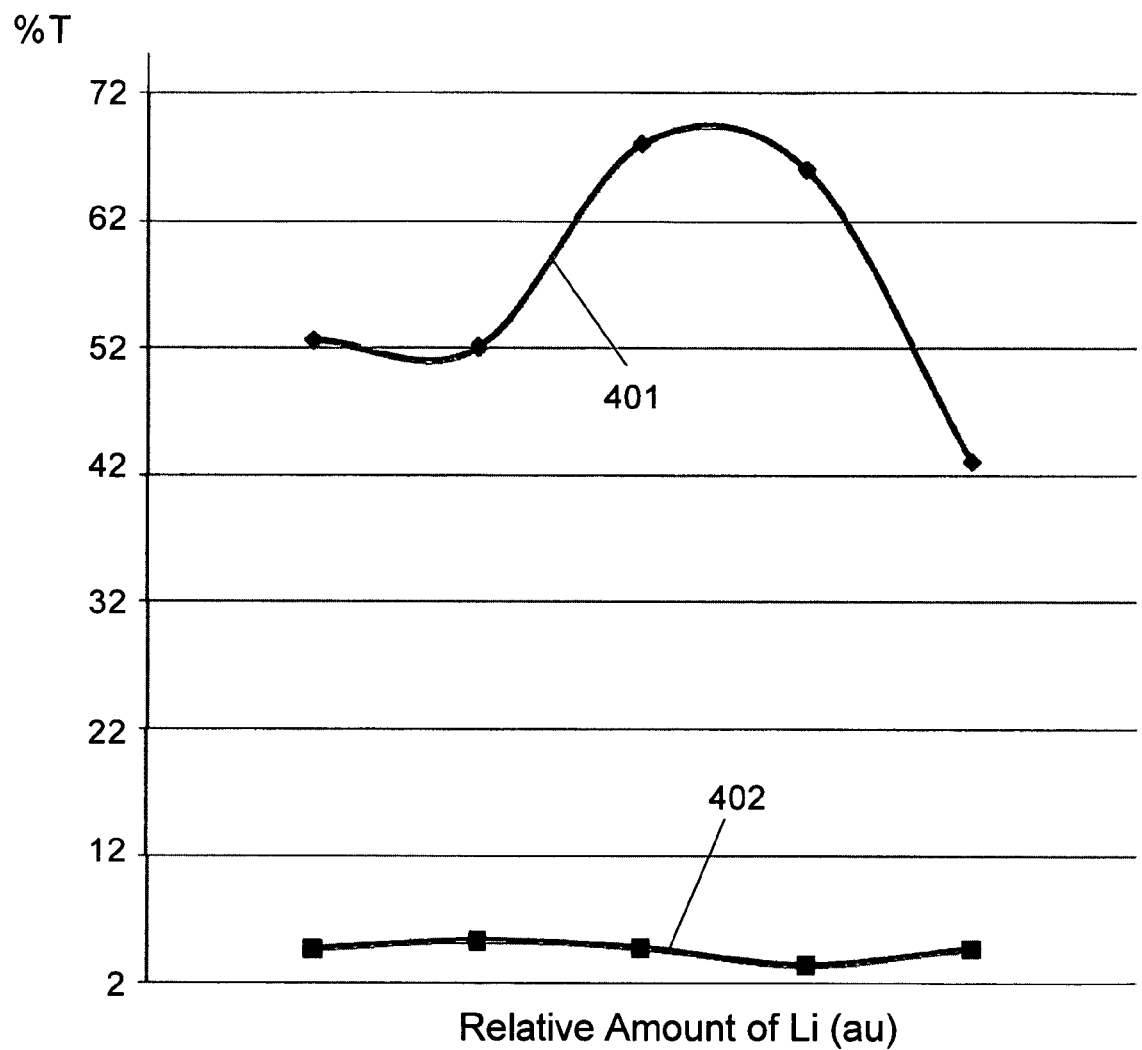
FIG. 4 is a graph depicting the percentage transmission (% T) as a function of the relative amount of lithium in arbitrary units (au) for an exemplary embodiment of a reverse-stack electrochromic device that has been lithiated through the top TCO.

FIG. 4 is a graph depicting the percentage transmission (% T) as a function of the relative amount of lithium in arbitrary units (au) for an exemplary embodiment of a reverse-stack electrochromic device that has been lithiated through the top TCO. "Arbitrary units" are used for the relative amount of lithium. The transmission has been measured by a silicon detector. Other types of detects will provide a different percentage transmission than depicted in FIG. 4. Percentage transmission (% T) for the bleached state is indicated at 401. Percentage transmission (% T) for the colored state is indicated at 402. As shown in FIG. 4, the percentage transmission increases from about 52% to about 68% as the relative amount of lithium is used. The percentage transmission then begins to drop as the relative amount of lithium increases beyond the peak percentage transmission.

Figure 5:
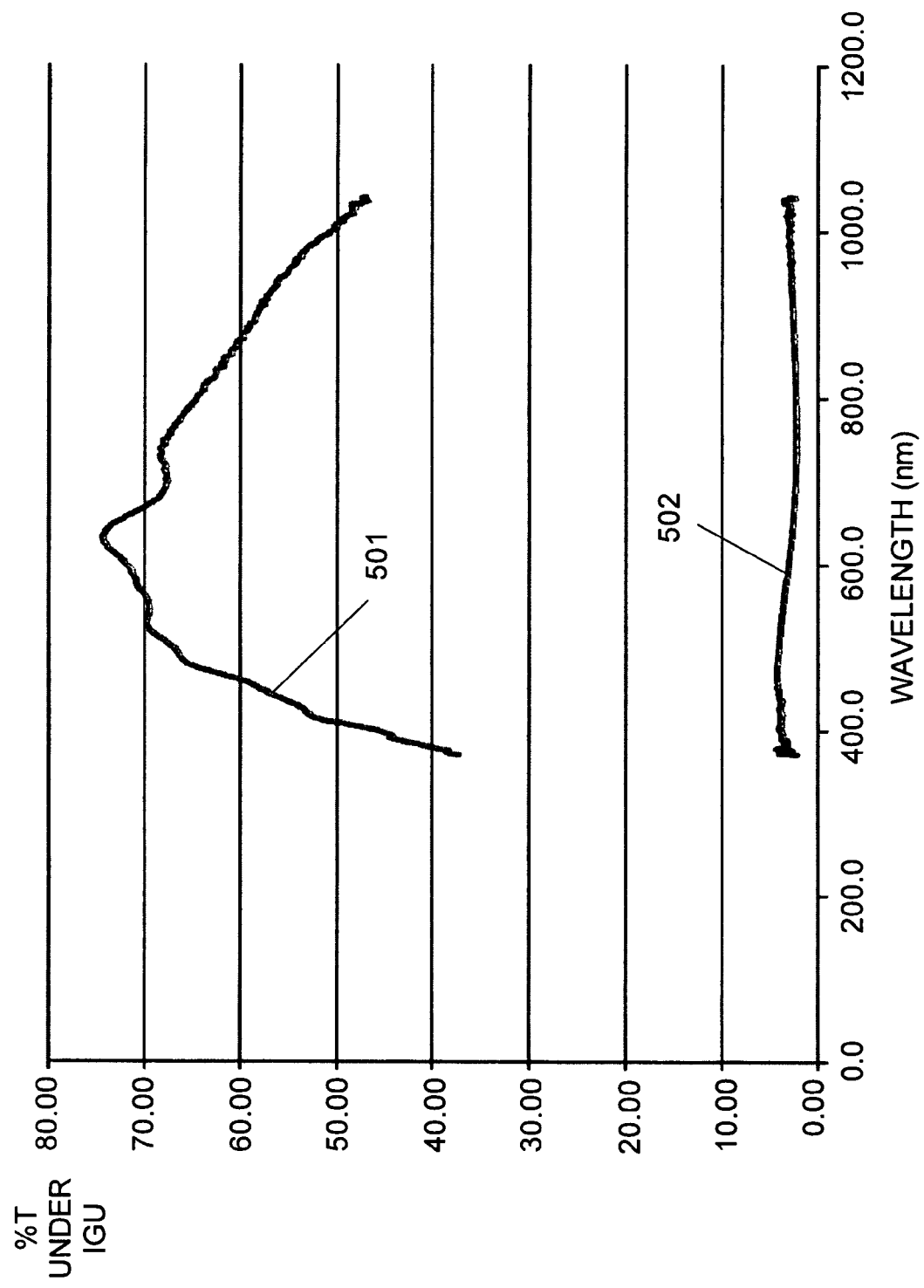
FIG. 5 is a graph depicting the percentage transmission (% T) as a function of wavelength for an exemplary embodiment of a reverse-stack electrochromic device that has been lithiated through the top TCO.

FIG. 5 is a graph depicting the percentage transmission (% T) as a function of wavelength for an exemplary embodiment of a reverse-stack electrochromic device that has been lithiated through the top TCO. The spectrum shown in FIG. 5 is for an electrochromic device that has been formed as part of an Insulated Glass Unit (IGU). Percentage transmission (% T) for the bleached state is indicated at 501. Percentage transmission (% T) for the colored state is indicated at 502. As shown in FIG. 5, the percentage transmission (% T) for the bleached state ranges from about 38% to about 75% over a wavelength range of about 380 nm to about 1050 nm. The percentage transmission for the colored state is less than or equal about 5% over a wavelength range of about 380 nm to about 1050 nm.

Figure 6:
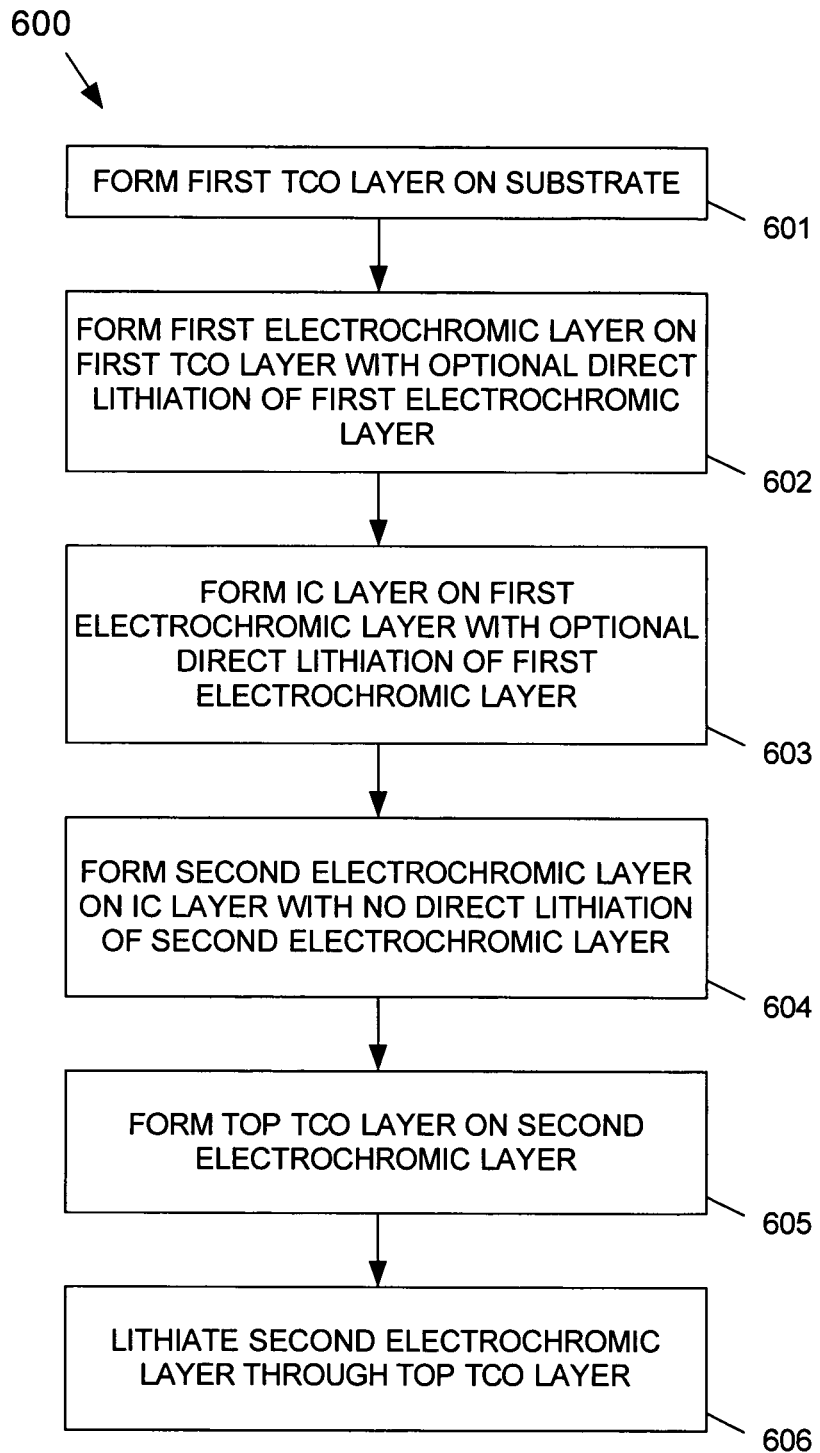
FIG. 6 depicts a method for forming a multi-layer electrochromic device according to the subject matter disclosed herein

FIG. 6 depicts a method 600 for forming a multi-layer electrochromic device according to the subject matter disclosed herein. At step 601, a first TCO layer is formed in a well-known manner on a substrate. At step 602, a first electrochromic layer is formed in a well-known manner on the first TCO layer. In one exemplary embodiment, the first electrochromic layer is an electrochromic (EC) layer. In an alternative exemplary embodiment, the first electrochromic layer is a counter electrode (CE) layer. At step 602, a conventional direct lithiation of the first electrochromic layer can be optionally performed in a well-known manner. At step 603, an ion conductor (IC) layer is formed in a well-known manner on the first electrochromic layer. A conventional direct lithiation of the IC layer can be optionally performed in a well-known manner. At step 604, a second electrochromic layer is formed in a well-known manner on the IC layer. In one exemplary embodiment, the second electrochromic layer is a counter electrode (CE) layer. In an alternative exemplary embodiment, the second electrochromic layer is an electrochromic (EC) layer. At step 604, no conventional direct lithiation of the second electrochromic layer is performed. At step 605, a top TCO layer is formed in a well-known manner on the second electrochromic layer. At step 606, the second electrochromic layer is lithiated through the top TCO layer using, for example, sputtering, evaporation and/or laser ablation techniques.

Although the foregoing disclosed subject matter has been described in some detail for purposes of clarity of understanding, it will be apparent that certain changes and modifications may be practiced that are within the scope of the appended claims. Accordingly, the present embodiments are to be considered as illustrative and not restrictive, and the subject matter disclosed herein is not to be limited to the details given herein, but may be modified within the scope and equivalents of the appended claims.

What is claimed is:

1. A method, comprising:
    forming a first transparent conductive layer on a substrate;
    forming an electrochromic structure on the first transparent conductive layer;
    forming a second transparent conductive layer on the electrochromic structure, the second transparent conductive layer comprising a transparent conductive oxide; and
    lithiating the electrochromic structure through the second transparent conductive layer by passing lithium through the second transparent conductive layer.

2. The method according to claim 1, wherein the electrochromic structure comprises a first side and a second side, and a counter electrode (CE) formed on the first side and an electrochromic (EC) electrode formed on the second side, the first side of the electrochromic structure being formed on the first transparent conductive layer, and the second transparent conductive layer being formed on the second side of the electrochromic structure, and wherein lithiating the electrochromic structure through the second transparent conductive layer comprises lithiating the electrochromic (EC) electrode of the electrochromic structure.

3. The method according to claim 2, wherein the electrochromic structure further comprises an ion conductor (IC) layer between the counter electrode (CE) and the electrochromic (EC) electrode, the method further comprising directly lithiating at least one of the counter electrode (CE) and the ion conductor (IC) layer.

4. The method according to claim 1, wherein the electrochromic structure comprises a first side and a second side, and an electrochromic (EC) electrode formed on the first side and a counter electrode (CE) formed on the second side, the first side of the electrochromic structure being formed on the first transparent conductive layer, and the second transparent conductive layer being formed on the second side of the electrochromic structure, and wherein lithiating the electrochromic structure through the second transparent conductive layer comprises lithiating the counter electrode (CE) of the electrochromic structure.

5. The method according to claim 4, wherein the electrochromic structure further comprises an ion conductor (IC) layer between the electrochromic layer (EC) and the counter electrode (CE), the method further comprising directly lithiating at least one of the electrochromic (EC) electrode and the ion conductor (IC) layer.

6. The method according to claim 1, wherein lithiating the electrochromic structure comprises lithiating the electrochromic structure at a temperature range of between about room temperature and about 500 C for the duration of the lithiation process.

7. The method according to claim 6, wherein lithiating the electrochromic structure further comprises lithiating the electrochromic structure by using at least one of sputtering, evaporation, laser ablation and exposure to a lithium salt.

8. An electrochromic device formed by a method comprising:

forming a first transparent conductive layer on a substrate;

forming an electrochromic structure on the first transparent conductive layer;

forming a second transparent conductive layer on the electrochromic structure, the second transparent conductive layer comprising a transparent conductive oxide; and lithiating the electrochromic structure through the second transparent conductive layer by passing lithium through the second transparent conductive layer.

9. The electrochromic device according to claim 8, wherein the electrochromic structure comprises a first side and a second side, and a counter electrode (CE) formed on the first side and an electrochromic (EC) electrode formed on the second side, the first side of the electrochromic structure being formed on the first transparent conductive layer, and the second transparent conductive layer being formed on the second side of the electrochromic structure, and wherein lithiating the electrochromic structure through the second transparent conductive layer comprises lithiating the electrochromic (EC) electrode of the electrochromic structure.

10. The electrochromic device according to claim 9, wherein the electrochromic structure further comprises an ion conductor (IC) layer between the counter electrode (CE) and the electrochromic (EC) electrode, the method forming the electrochromic device further comprising directly lithiating at least one of the counter electrode (CE) and the ion conductor (IC) layer.

11. The electrochromic device according to claim 8, wherein the electrochromic structure comprises a first side and a second side, and an electrochromic (EC) electrode formed on the first side and a counter electrode (CE) formed on the second side, the first side of the electrochromic structure being formed on the first transparent conductive layer, and the second transparent conductive layer being formed on the second side of the electrochromic structure, and wherein lithiating the electrochromic structure through the second transparent conductive layer comprises lithiating the counter electrode (CE) of the electrochromic structure.

12. The electrochromic device according to claim 11, wherein the electrochromic structure further comprises an ion conductor (IC) layer between the electrochromic layer (EC) and the counter electrode (CE), the method forming the electrochromic device further comprising directly lithiating at least one of the electrochromic (EC) electrode and the ion conductor (IC) layer.

13. The electrochromic device according to claim 8, wherein lithiating the electrochromic structure comprises lithiating the electrochromic structure at a temperature range of between about room temperature and about 500 C for the duration of the lithiation process.

14. The electrochromic device according to claim 13, wherein lithiating the electrochromic structure further comprises lithiating the electrochromic structure by using at least one of sputtering, evaporation, laser ablation and exposure to a lithium salt.

15. The electrochromic device according to claim 8, wherein the electrochromic device is part of an Insulated Glass Unit (IGU), and wherein a percentage transmission of the electrochromic device in a bleached state is greater than or equal to about 65% at a wavelength of about 600 nm.

16. The electrochromic device according to claim 8, wherein a percentage transmission of the electrochromic device in a colored state is less than or equal to about 5% over a wavelength range of about 380 nm to about 1050 nm.

17. The electrochromic device according to claim 8, wherein the second transparent conductive layer comprises indium tin oxide (ITO), aluminum zinc oxide (AZO), fluorine-doped tin oxide (FTO), antimony-doped tin oxide (ATO), or fluorine-doped aluminum oxide (FAO).

18. The electrochromic device according to claim 1, wherein the second transparent conductive layer comprises indium tin oxide (ITO), aluminum zinc oxide (AZO), fluorine-doped tin oxide (FTO), antimony-doped tin oxide (ATO), or fluorine-doped aluminum oxide (FAO).

\* \* \* \* \*